(12) United States Patent
Vampola et al.

(10) Patent No.: US 8,174,602 B2
(45) Date of Patent: May 8, 2012

(54) IMAGE SENSING SYSTEM AND METHOD UTILIZING A MOSFET

(75) Inventors: John L. Vampola, Santa Barbara, CA (US); Micky R. Harris, Lompoc, CA (US)

(73) Assignee: Raytheon Company, Waltham, MA (US)

( * ) Notice: Subject to any disclaimer, the term of this patent is extended or adjusted under 35 U.S.C. 154(b) by 676 days.

(21) Appl. No.: 12/354,467

(22) Filed: Jan. 15, 2009

(65) Prior Publication Data

US 2010/0177229 A1     Jul. 15, 2010

(51) Int. Cl.
*H04N 3/14* (2006.01)
*H04N 5/335* (2006.01)

(52) U.S. Cl. ........................................ 348/308; 348/294
(58) Field of Classification Search .................. 348/294, 348/308

See application file for complete search history.

(56) References Cited

U.S. PATENT DOCUMENTS

2004/0251394 A1   12/2004   Rhodes et al.

FOREIGN PATENT DOCUMENTS

| | | |
|---|---|---|
| EP | 1 589 583 A2 | 10/2005 |
| EP | 1 887 626 A1 | 2/2008 |
| GB | 2 330 905 | 5/1999 |
| WO | WO 99/44359 | 9/1999 |

OTHER PUBLICATIONS

PCT, "Notification of Transmittal of the International Search Report and the Written Opinion of the International Searching Authority, or the Declaration," Application No. PCT/US2010/020288, Mailed Apr. 1, 2010, 11 pages.

*Primary Examiner* — William Choi
(74) *Attorney, Agent, or Firm* — Lando & Anastasi, LLP

(57) ABSTRACT

A unit cell includes a MOSFET and an integration capacitor. The MOSFET includes a source, a drain, and a gate. The drain is coupled to the source, and the MOSFET is operable to store a first portion of an electric charge corresponding to a detected light intensity. The integration capacitor includes a first end and a second end. The first end is coupled to the drain of the MOSFET and the second end is coupled to a ground. The integration capacitor is operable to store a second portion of the electric charge corresponding to the detected light intensity.

22 Claims, 4 Drawing Sheets

IMAGE SENSING SYSTEM AND METHOD UTILIZING A MOSFET

TECHNICAL FIELD

This disclosure relates in general to image sensing and more particularly to an image sensing system and method utilizing a MOSFET.

BACKGROUND

Image sensing circuits are utilized in various image capturing devices such as digital cameras and digital scanners. Image sensing circuits typically consist of an array of detectors and unit cells that generate and store a charge in proportion to the light intensity received at the location of each detector. Once the charge has been stored in the unit cell, it may be read and converted into a pixel of a final image.

SUMMARY OF THE DISCLOSURE

According to one embodiment, a unit cell includes a MOSFET and an integration capacitor. The MOSFET includes a source, a drain, and a gate. The drain is coupled to the source, and the MOSFET is operable to store a first portion of an electric charge corresponding to a detected light intensity. The integration capacitor includes a first end and a second end. The first end is coupled to the drain of the MOSFET and the second end is coupled to a ground. The integration capacitor is operable to store a second portion of the electric charge corresponding to the detected light intensity.

Technical advantages of certain embodiments may include providing high dynamic range capabilities. This results in improved image sensing in both low and high ambient light situations. Other advantages may include providing a lower kTC reset noise over typical unit cells. Embodiments may eliminate certain inefficiencies such as poor injection efficiency.

Other technical advantages will be readily apparent to one skilled in the art from the following figures, descriptions, and claims. Moreover, while specific advantages have been enumerated above, various embodiments may include all, some, or none of the enumerated advantages.

BRIEF DESCRIPTION OF THE DRAWINGS

For a more complete understanding of the present disclosure and its advantages, reference is now made to the following description, taken in conjunction with the accompanying drawings, in which.

DETAILED DESCRIPTION OF THE DISCLOSURE

Figure 1:
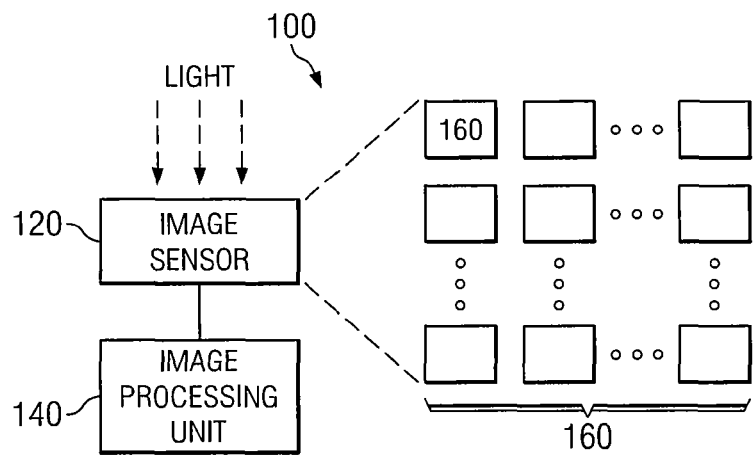
FIG. 1 is a simplified schematic diagram illustrating an image sensing device that may be used to capture images.

Embodiments of the present disclosure and its advantages are best understood by referring to FIGS. 1 through 7 of the drawings, like numerals being used for like and corresponding parts of the various drawings.

There are many types of image capturing devices such as digital cameras, video cameras, and other photographic and/or image capturing devices. These image capturing devices may use image sensors such as active pixel sensors (APS) or other suitable light sensing devices in order to capture an image. For example, an APS may be composed of an array of unit cells that receives light from a lens. Each unit cell in the array generally corresponds to the smallest portion of a digital image known as a "pixel". The light causes each unit cell to accumulate an electric charge proportional to the light intensity at that location. Circuitry and/or software in the image capturing device then interprets the charge accumulated in the unit cell to produce the corresponding pixel of the final image.

Typically, each unit cell in the array includes a component to store the electric charge until it can be read and analyzed. In some unit cells, this component may be an integration capacitor. The size of the integration capacitor may vary according to the specific application of the imaging device, and is usually chosen to accommodate the greatest amount of electric charge expected to be encountered for the application.

Image capturing devices are routinely exposed to both low ambient and high ambient light situations. As a result, it is desirable for an image capturing device to have a high dynamic range—the ability to perform well in both low ambient and high ambient light situations. In a low ambient light situation such as pictures taken at night, indoors, in shadows, or other situations where there is a relatively low amount of ambient light, the electric charge accumulated in the unit cell will be relatively low. As a result, a relatively small amount of capacitance is needed to store electric charge in low ambient light situations and therefore a relatively small integration capacitor may be desired. Conversely, in high ambient light situations such as a sunny day, a well-lit room, or other situations where there is a relatively large amount of ambient light, the electric charge accumulated in the unit cell will be relatively high due to the greater intensity of the light captured by the image capture device. As a result, a relatively large amount of capacitance is needed to store electric charge in high ambient light situations and therefore a relatively large integration capacitor may be needed.

As mentioned above, most integration capacitors are chosen to accommodate the greatest amount of electric charge expected to be encountered for a specific application. Because of this, integration capacitors tend to be relatively large in size so that they will not saturate and cause a loss of information. This works well for high ambient light situations which generate larger amounts of electric charge, but is less desirable in low ambient light situations where there is a relatively small amount of electric charge to store. In low ambient light situations, there will be a relatively low signal-to-noise ratio due to the lower electric charge. To combat the low signal-to-noise ratio in these situations, a relatively small integration capacitor is more desirable. This creates a dichotomy for unit cell designers: choose a small integration capacitor that will perform well in low ambient light situations but may easily saturate in high ambient light situations, or choose a larger integration capacitor that will not saturate in high ambient light situations but will perform poorer in low ambient light situations.

Additionally, in order to capture an image, most image capturing devices having an integration capacitor must reset the integration capacitor through a switch prior to capturing the image. This reset involves applying a voltage V to the integration capacitor in order to reset the voltage across the integration capacitor to a known value of V. In reality, however, the voltage measured across the integration capacitor after this reset will not be exactly V, but rather will be +/− some small amount of error. This error is known as "kTC noise", or "reset noise" (discussed in more detail below), and is undesirable due to its ultimate effect on image quality.

The teachings of the disclosure recognize that it would be desirable for a unit cell to be able to perform optimally in both low ambient and high ambient light situations (i.e., to have a high dynamic range) while providing a low kTC reset noise compared to typical unit cells. FIGS. 1 through 7 below illustrate an image sensing system and method that addresses problems associated with typical unit cells.

FIG. 1 is a block diagram illustrating an image capture device 100 that may be used to capture images. For example, device 100 may be a digital camera, video camera, or any other photographic and/or image capturing device. Image capture device 100 includes image sensor 120 and image processing unit 140. Image sensor 120 may be an APS or any other suitable light sensing device that can capture images. Image sensor 120 may include, for example, a diode, a charge-coupled device (CCD), or any other photovoltaic detector or transducer. Image processing unit 140 may be a combination of hardware, software, or firmware that is operable to receive signal information from image sensor 120 and convert the signal information into an electronic image.

Figure 2A:
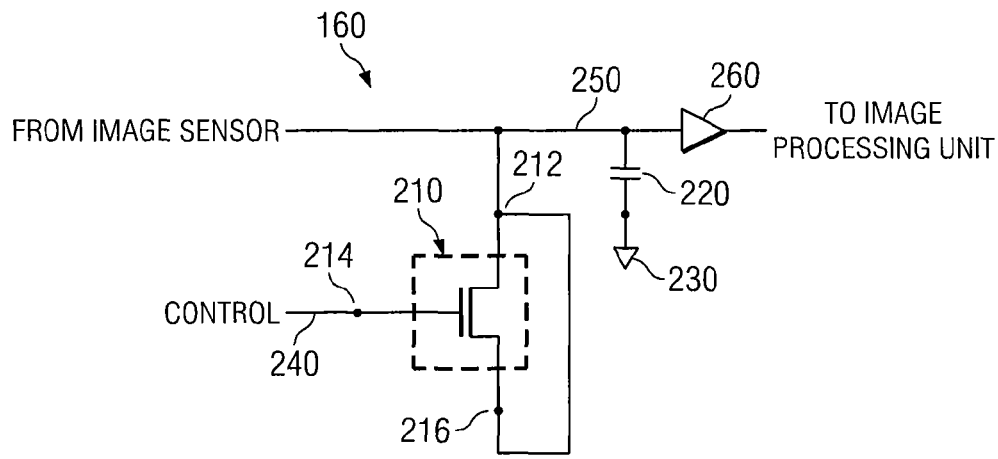
FIGS. 2A and 2B are circuit diagrams of example unit cells of the system of FIG. 1.
Figure 2B:
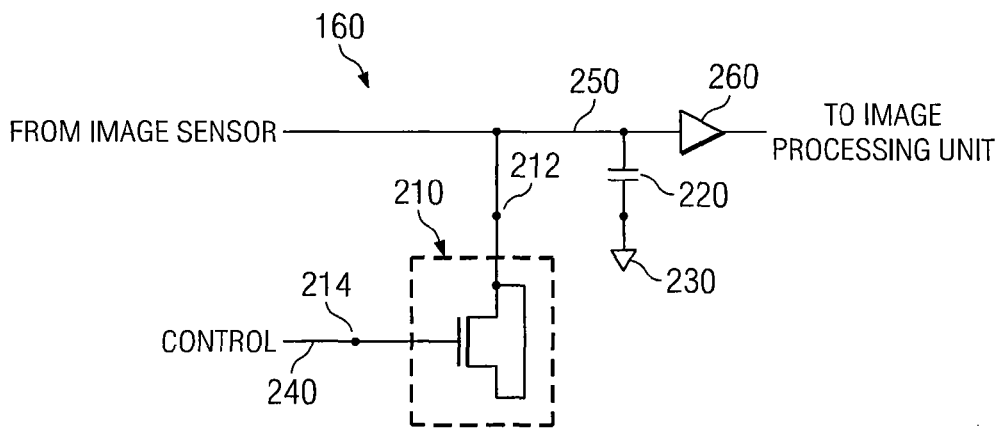

Image sensor 120 may include an array of unit cells 160. Unit cells 160 may accumulate charge proportional to the light intensity at the location of a coupled detector and may correspond to a pixel in the captured electronic image. Unit cell 160 may temporarily store the accumulated charge for use by processing unit 140 to create an image. FIGS. 2A and 2B below, for example, illustrate embodiments of unit cell 160 that utilize a MOSFET in addition to an integration capacitor to store the accumulated charge.

FIGS. 2A and 2B are circuit diagrams illustrating embodiments of unit cell 160 that may be coupled to image sensor 120 and image processing unit 140. Unit cell 160 includes a MOSFET 210, an integration capacitor 220, a ground 230, a control node 240, an integration node 250, and a buffer 260. MOSFET 210 includes a drain 212, a gate 214, and a source 216. Control node 240 is coupled to gate 214, and source 216 is coupled to drain 212. Integration node 250 is coupled to drain 212 and a first end of integration capacitor 220. The second end of integration capacitor 220 is coupled to ground 230. In some embodiments, unit cell 160 may comprise a different material than image sensor 120.

In operation, a voltage is received on integration node 250 from image sensor 120 that corresponds to the amount of light received at image sensor 120. MOSFET 210 and/or integration capacitor 220 then stores the charge according to the processes described in more detail below. After the charge has been stored, the stored charge may be converted into a voltage and driven out of unit cell 160 through buffer 260, and the value of the voltage may be sampled by processing unit 140 in order to digitize and store the value into some form of memory. In other embodiments, however, the accumulated charge may be sampled by processing unit 140 instead of the voltage.

As previously described, unit cells typically include only an integration capacitor to store charge from image sensor 120. Unit cell 160, however, includes a relatively small integration capacitor 220 with a fixed capacitance $C_{Integration}$ as well as MOSFET 210 with a capacitance of $C_{MOSFET}$ that may be selectively coupled to integration node 250 by enabling gate 214 with control node 240. Accordingly, the total capacitance of unit cell 160 can be modulated from a small value of $C_{Integration}$ to a larger value of $C_{Integration} + C_{MOSFET}$ by turning gate 214 "on" via control node 240. This provides numerous advantages and eliminates many problems associated with typical unit cells as discussed below.

For an image sensor to have high dynamic range capabilities, it is desirable to have dual, simultaneous gains: a low gain in high ambient light situations and a high gain in low ambient light situations. The transimpedance $Z_t$ (gain) of a circuit may be calculated according to equation (1) below:

$$Z_t = \frac{1}{C_{total}} \quad (1)$$

where $C_{total}$ is the total amount of capacitance of the node. Unit cell 160 is capable of providing a low gain in high ambient light situations by the addition of MOSFET 210. In high ambient light situations, gate 214 may be enabled via control node 240 in order to provide a total capacitance along integration node 250 of $C_{Integration} + C_{MOSFET}$. Equation (1) then becomes equation (2) below:

$$Z_t = \frac{1}{C_{Integration} + C_{MOSFET}} \quad (2)$$

As a result, the gain $Z_t$ becomes lower. The voltage on integration node 250 may then be read by image processing unit 140. For low ambient light situations, however, unit cell 160 may provide a high gain by the subtraction of MOSFET 210. After the voltage on integration node 250 has been read by image processing unit 140, gate 214 may be disabled via control node 240 in order to remove $C_{MOSFET}$ from integration node 250. This will force the charge that was previously stored in MOSFET 210 into the small integration capacitor 220. The gain may then be calculated according to equation (3) below:

$$Z_t = \frac{1}{C_{Integration}} \quad (3)$$

Since integration capacitor 220 is relatively small in size, the gain from equation (3) will be higher compared to when the capacitance of MOSFET 210 was included in equation (2). This results in a higher gain and a higher signal-to-noise ratio that is desirable for low ambient light situations.

Additionally, unit cell 160 provides the advantage of having a lower kTC noise (reset noise) than typical unit cells having the same amount of total capacitance. Reset noise may be calculated according to equation (4) below:

$$\text{reset noise} = \frac{\sqrt{kTC_{total}}}{q} \text{ (electrons RMS)} \quad (4)$$

where k is Boltzmann's constant ($1.38 \times 10^{-23}$ W sec K$^{-1}$), T is temperature in degrees Kelvin, $C_{total}$ is the total capacitance in farads, and q is the electronic charge ($1.6 \times 10^{-19}$ coulombs/electron). When utilizing unit cell 160, a reset may occur while gate 214 is turned "off" via control node 240. As a result, equation (4) becomes equation (5) below:

$$\text{reset noise} = \frac{\sqrt{kTC_{Integration}}}{q} \text{ (electrons RMS)} \quad (5)$$

As can be seen from equation (5), the reset noise will be lower than a unit cell having a total capacitance of $C_{Integration}+C_{MOSFET}$. After the reset, gate 214 may then be turned "on" via control node 240 in order to couple MOSFET 210 to integration node 250 and increase the capacitance of unit cell 160 back to $C_{Integration}+C_{MOSFET}$ but without any addition of reset noise due to $C_{MOSFET}$. As was the case for the high dynamic range advantage discussed above, it is advantageous to make $C_{Integration}$ as small as possible by choosing a small integration capacitor 220. As a result, unit cell 160 will provide a lower reset noise than typical unit cells.

Furthermore, unit cell 160 provides an increased injection efficiency over typical unit cells. Typically, a detector such as image sensor 120 will have an inherent capacitance, $C_{Detector}$. As a result, the voltage $V_{out}$ measured by image processing unit 140 at integration node 250 may be calculated by equation (6) below:

$$V_{out} = \frac{Q_{in}}{C_{Detector} + C_{Integration} + C_{MOSFET}}(V) \quad (6)$$

where $Q_{in}$ corresponds to the voltage at the detector. As a result, the injection efficiency—the efficiency at which the charge stored in $C_{Detector}$ gets transferred to unit cell 160—may be calculated by equation (7) below:

$$\text{injection efficiency} = \frac{C_{Integration} + C_{MOSFET}}{C_{Detector} + C_{Integration} + C_{MOSFET}} \quad (7)$$

If MOSFET 210 is then turned "off" after the sample and hold release, then the gain may be measured according to equation (8) below:

$$V_{out} = \frac{Q_{in}}{C_{Integration}} \Big/ \frac{C_{Integration} + C_{MOSFET}}{C_{Detector} + C_{Integration} + C_{MOSFET}}(V) \quad (8)$$

As can be seen from these equations, as $C_{MOSFET}$ increases, the transimpedance (gain) becomes dependent on $C_{Integration}$ and the injection onto $C_{Integration}$ approaches 100%. Therefore, the injection efficiency of unit cell 160 is significantly improved over typical unit cells.

In some embodiments, source 216 of MOSFET 210 may not actually be physically implemented as shown in FIG. 2A. For example, FIG. 2B illustrates an embodiment of MOSFET 210 having a drain 212 but not a source 216. In this embodiment, the source of MOSFET 210 does not have a physical implant, but rather is coupled to drain 212 internally. In other words, MOSFET 210 has one physical implant that is connected to integration node 250. In the embodiment shown, the physical implant connected to integration node 250 is shown as drain 212. It should be noted, however, that the physical implant of MOSFET 210 that is connected to integration node 250 may be either the source or drain of MOSFET 210.

FIGS. 3-6 below illustrate certain embodiments utilizing unit cell 160 described above in reference to FIGS. 2A and 2B.

Figure 3:
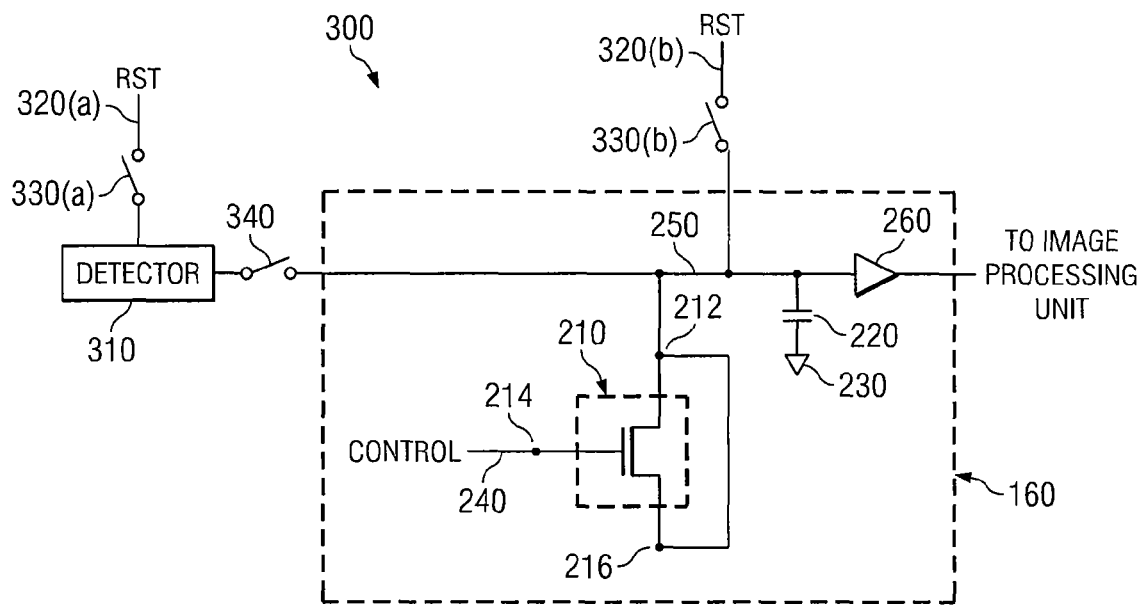
FIGS. 3 through 6 illustrate various circuit diagrams that may utilize the unit cell of FIGS. 2A and 2B.

FIG. 3 is a circuit diagram illustrating a source-follower per detector (SFD) circuit 300 utilizing unit cell 160 described above. In addition to the previously described components, circuit 300 includes a detector 310, reset nodes 320, reset switches 330, and isolation switch 340. Reset nodes 320 are coupled to reset switches 330. Reset switch 330(a) is in turn coupled to detector 310, and reset switch 330(b) is coupled to integration node 250. Detector 310 may be a photovoltaic detector including, but not limited to, a CCD, a diode, or other transducer.

In operation, circuit 300 may be initially reset using reset switches 330. To reset circuit 300, isolation switch 340 is moved to the open position (as shown) and gate 214 is turned "off" via control node 240. The part of the circuit to the left of isolation switch 340 is reset by closing reset switch 330(a) and allowing the voltage from reset node 320(a) to reset detector 310. The circuitry to the right of isolation switch 340 is reset according to the process described to avoid a large reset noise. Specifically, while gate 214 is "off", reset switch 330(b) is closed allowing the voltage from reset node 320(b) to reset integration capacitor 220. Gate 214 may then be turned to the "on" position, reset switches 330 may be returned to their open positions, and isolation switch 340 may be moved to the closed position.

After resetting, circuit 300 is ready to capture an image. First, detector 310 generates an electric charge proportional to the light intensity it receives. This charge is stored in MOSFET 210 and integration capacitor 220 for a later reading by image processing unit 140. After the image is captured, isolation switch 340 may be opened in order to isolate detector 310 from MOSFET 210 and integration capacitor 220. At this point, detector 310 may be reset via reset switch 330(a) without affecting the charge stored in MOSFET 210 and integration capacitor 220. Detector 310 may also begin capturing (i.e., integrating) another image at this time.

Also while isolation switch 340 is open, image processing unit 140 may read the charge stored in MOSFET 210 and integration capacitor 220 and/or detect the voltage on integration node 250 in order to generate the final image. In some embodiments, image processing unit 140 may perform only one read operation. In other embodiments, image processing unit 140 may perform a double read of the data according to the process described above in order to achieve high dynamic range. On the first read, image processing unit 140 may perform the read operation while gate 214 is "on" in order to perform a low-gain read. It may then turn gate 214 "off" in order to perform a high-gain read.

Figure 4:
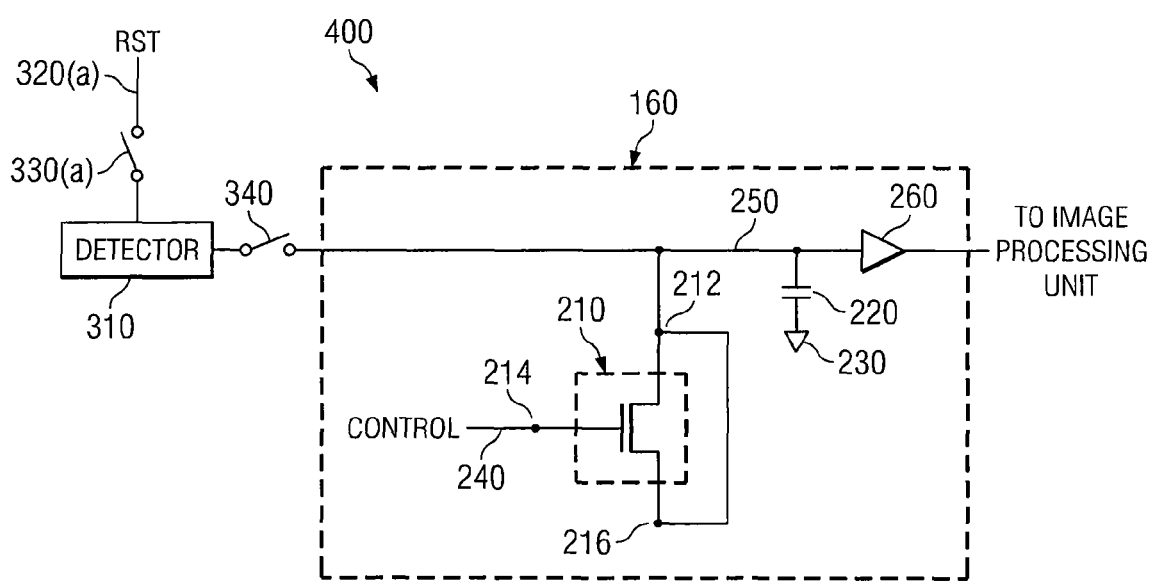

Because circuit 300 may integrate a new image with detector 310 while isolation switch 340 is open and image processing unit 140 is reading the previous data from integration node 250, it is known as an "integrate while read" circuit. FIG. 4 below illustrates a similar embodiment utilizing unit cell 160, but it is known as an "integrate then read" circuit.

FIG. 4 is a circuit diagram illustrating another SFD circuit 400 utilizing unit cell 160 described above. Circuit 400 is similar to circuit 300 except that circuit 400 does not include reset switch 330(b) or reset node 320(b).

In operation, circuit 400 may be initially reset using reset switch 330(a). To reset circuit 400, isolation switch 340 is moved to the closed position and gate 214 is turned "off" via control node 240. Circuit 400 is then reset by closing reset switch 330(a) and allowing the voltage from reset node 320(a) to reset detector 310 and integration capacitor 220. Because gate 214 is "off", MOSFET 210 does not contribute a capacitance to integration node 250 and therefore the reset noise will be limited to the amount of reset noise from integration capacitor 220. After the reset, reset switch 330(*a*) may be returned to the open position and gate 214 may then be turned to the "on" position.

After resetting, circuit 400 is ready to capture an image. First, detector 310 generates an electric charge proportional to the light intensity it receives. This charge is stored in MOSFET 210 and integration capacitor 220 for later reading by image processing unit 140. When it is ready, image processing unit 140 may read the charge stored in MOSFET 210 and integration capacitor 220 and/or detect the voltage on integration node 250 in order to generate the final image. In some embodiments, image processing unit 140 may perform only one read operation. In other embodiments, image processing unit 140 may perform a double read of the data according to the process described above in order to achieve high dynamic range. On the first read, image processing unit 140 may perform the read operation while gate 214 is "on" in order to perform a low-gain read. It may then turn gate 214 "off" in order to perform a high-gain read.

In some embodiments, a method of image capture known as "ripple capture" may be used. For example, FIG. 5 below illustrates a particular embodiment that may be utilized in order to perform ripple operations.

Figure 5:
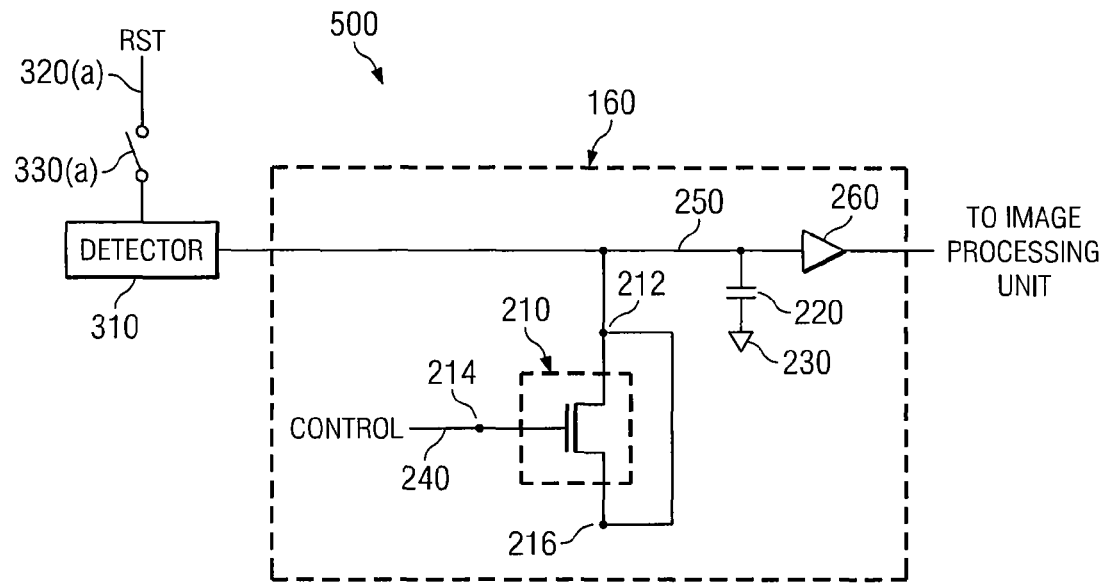

FIG. 5 is a circuit diagram illustrating another SFD circuit 500 utilizing unit cell 160 described above. Circuit 500 is similar to circuit 400 except that circuit 500 does not include isolation switch 340.

In operation, circuit 500 may be utilized by a particular method for image capture known as ripple capture. Ripple capture is a method that captures each row of pixels from image sensor 120 in order. For example, ripple capture may expose the top row of detectors 310 to light, followed by the second row, followed by the third row, and so forth until the last row of detectors 310 are exposed to light. A particular method for image processing unit 140 to receive pixel information captured by detectors 310 and stored in MOSFET 210 and/or integration capacitor 220 may be ripple read. Ripple read is a method that processes each row of pixels from image sensor 120 in order. Similar to ripple capture, ripple read may process the top row of pixels of image sensor 120, followed by the second row, followed by the third row, and so forth until the last row of pixels of image sensor 120 is processed. A ripple reset operation to reset the rows of pixels of image sensor 120 may be performed similarly.

These methods may be performed on consecutive rows. A ripple capture operation may begin with the first row of image sensor 120. As the ripple capture operation moves to the second row, a ripple read operation may begin on the first row of image sensor 120. After the ripple capture operation moves to the third row, the ripple read operation may begin on the second row and a ripple reset operation may begin on the first row. This may continue until the last row is processed. Once the last row is processed, the image may be processed and stored by processing unit 140.

Figure 6:
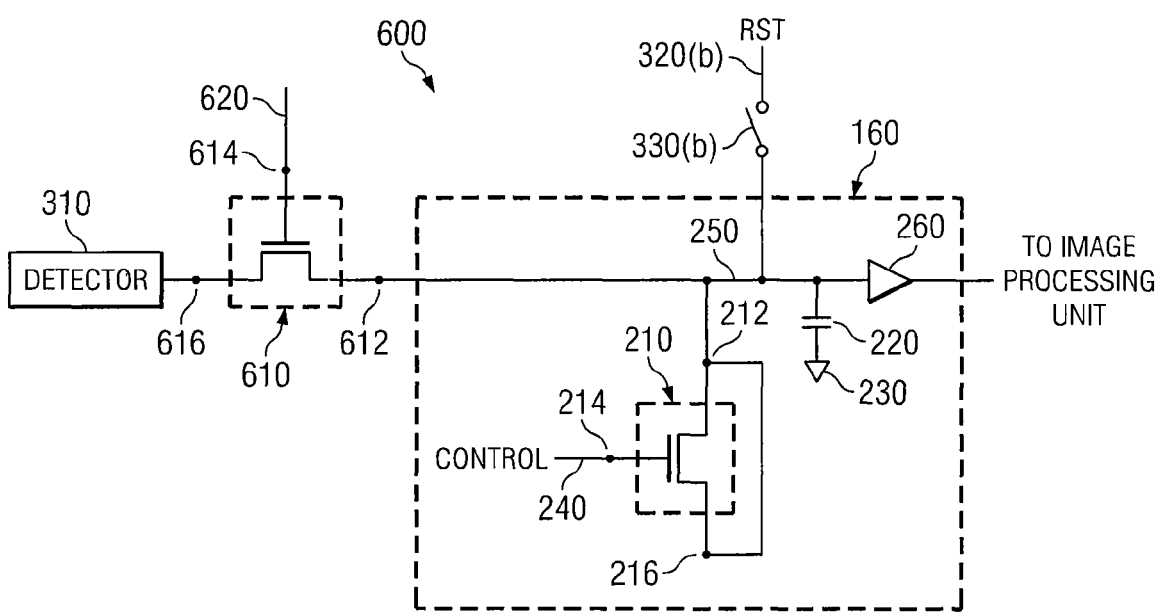

FIG. 6 is a circuit diagram illustrating a direct injection circuit 600 utilizing unit cell 160 described above. In addition to the previously described components, circuit 600 includes a control node 620 and a MOSFET 610 having a drain 612, a gate 614, and a source 616. Source 616 is coupled to detector 310, drain 612 is coupled to integration node 250, and gate 614 is coupled to control node 620.

In operation, circuit 600 may be initially reset using reset switch 330(*b*). To reset circuit 600, gate 214 is turned "off" via control node 240 in order to avoid a large reset noise. While gate 214 is "off", reset switch 330(*b*) is closed allowing the voltage from reset node 320(*b*) to reset integration capacitor 220. Reset switch 330(*b*) may then be returned to the open position and gate 214 may then be turned to the "on" position.

After resetting, circuit 600 is ready to capture an image onto MOSFET 210. Control node 620 provides a constant voltage to gate 614 such that any image current flows to drain 612 while maintaining a constant voltage on source 616. Detector 310 generates an electric charge proportional to the light intensity it receives. This charge is stored in MOSFET 210 and integration capacitor 220 for later reading by image processing unit 140 through buffer 260. When it is ready, image processing unit 140 may read the charge stored in MOSFET 210 and integration capacitor 220 and/or detect the voltage on integration node 250 in order to generate the final image. In some embodiments, image processing unit 140 may perform only one read operation. In other embodiments, image processing unit 140 may perform a double read of the data according to the process described above in order to achieve high dynamic range. On the first read, image processing unit 140 may perform the read operation while gate 214 is "on" in order to perform a low-gain read. It may then turn gate 214 "off" in order to perform a high-gain read.

Figure 7:
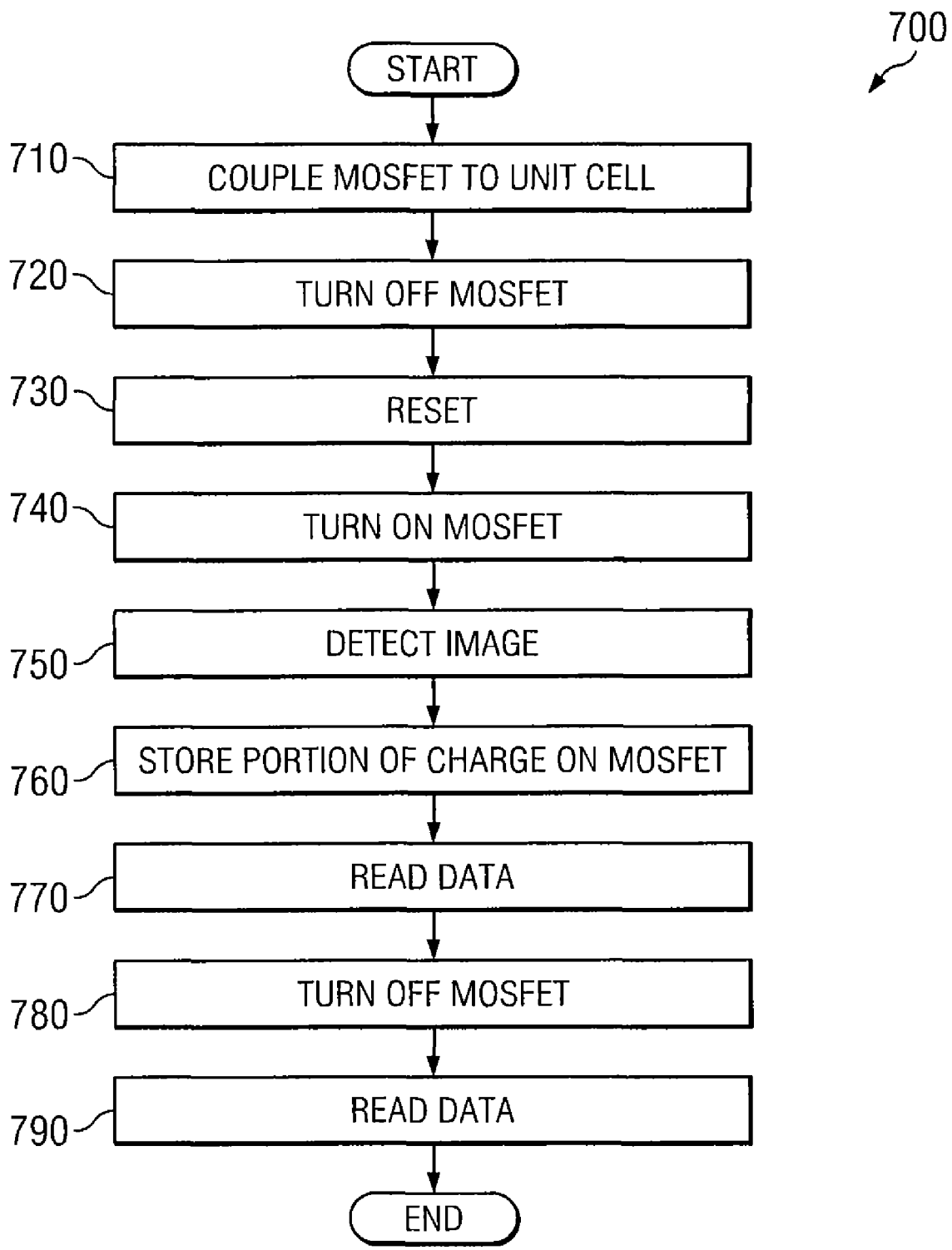
FIG. 7 is a flow chart illustrating an image sensing method in accordance with a particular embodiment of this disclosure.

FIG. 7 illustrates an example method 700 that may be utilized to efficiently and effectively sense an image according teachings of the disclosure. Method 700 begins in step 710 where a MOSFET is coupled to a unit cell. In step 720, the MOSFET is turned off via its control gate. In step 730, the unit cell is reset. In step 740, the MOSFET is turned on via its control gate. By having the MOSFET off during the reset, the reset noise of the unit cell will be lower according to description above.

In step 750, a detector attached to the unit cell detects an image and generates a charge corresponding to the light it receives. In step 760, at least a portion of the charge generated by the detector is stored in the MOSFET. The MOSFET may store all of the charge or a portion may also be stored in other components such as one or more integration capacitors. In step 770, the charge stored in the unit cell or the voltage of the unit cell is read by an image processing unit where it is converted into a pixel of the final image.

In some embodiments, additional steps 780 and step 790 may also be performed in order to achieve a high dynamic range. In step 780, the MOSFET is turned off via its control gate. In step 790, the charge stored in the unit cell or the voltage of the unit cell is read once again by an image processing unit where it is converted into a pixel of the final image. By reading the data twice, some embodiments may achieve both a high and low gain and therefore have a higher dynamic range than embodiments that read the data only once.

Although the embodiments in the disclosure have been described in detail, numerous changes, substitutions, variations, alterations, and modifications may be ascertained by those skilled in the art. For example, image sensor 120 may include any type of sensor including an APS, a separate detector, a separate detector material, or an alternate transducer other than an optical detector. Additionally or alternatively, while the disclosure is described predominantly in reference to visible detectors, the embodiments disclosed herein may be utilized with many types of detectors including, but not limited to, visible, infrared, ultraviolet, x-ray, or other radiation detectors. It is intended that the present disclosure encompass all such changes, substitutions, variations, alterations and modifications as falling within the spirit and scope of the appended claims.

What is claimed is:

1. A unit cell comprising:
 a MOSFET having a source, a drain, and a gate, the drain coupled to the source, the MOSFET operable to store a first portion of an electric charge corresponding to a detected light intensity; and
 an integration capacitor having a first end and a second end, the first end coupled to the drain of the MOSFET and the second end coupled to a ground, the integration capacitor operable to store a second portion of the electric charge corresponding to the detected light intensity.

2. The unit cell of claim 1 wherein the drain of the MOSFET is further coupled to a detector operable to generate the electric charge corresponding to a detected light intensity.

3. The unit cell of claim 2 wherein the detector is selected from the group consisting of visible light detectors, infrared detectors, ultraviolet light detectors, and x-ray detectors.

4. The unit cell of claim 2 wherein the unit cell and the detector comprise an active pixel sensor (APS).

5. The unit cell of claim 2 wherein the unit cell comprises a different material than the detector.

6. The unit cell of claim 1 wherein the unit cell is coupled to an image processor.

7. The unit cell of claim 6 wherein the image processor is operable to read the first portion of the electric charge stored in the MOSFET and the second portion of the electric charge stored in the integration capacitor.

8. The unit cell of claim 6 wherein the image processor is operable to read a voltage of the unit cell corresponding to the detected light intensity.

9. The unit cell of claim 1 wherein the MOSFET is operable to be turned off before a reset of the unit cell occurs and to be turned on after a reset of the unit cell occurs, wherein the MOSFET does not contribute to a reset noise of the unit cell.

10. The unit cell of claim 1 wherein the source of the MOSFET does not have a physical implant.

11. A system for image sensing comprising:
 a detector operable to generate an electric charge in proportion to a detected light intensity;
 a unit cell coupled to the detector and operable to receive the electric charge, the unit cell comprising:
  a MOSFET having a source, a drain, and a gate, the drain coupled to both the source and the detector, the MOSFET operable to store a first portion of the charge generated by the detector; and
  an integration capacitor having a first end and a second end, the first end coupled to the drain of the MOSFET and the detector and the second end coupled to a ground, the integration capacitor operable to store a second portion of the charge generated by the detector; and
 an image processor coupled to the unit cell.

12. The system for image sensing of claim 11 wherein the image processor is operable to read the first portion of the charge stored in the MOSFET and the second portion of the charge stored in the integration capacitor.

13. The system for image sensing of claim 11 wherein the image processor is operable to read a voltage of the unit cell corresponding to the detected light intensity.

14. The system for image sensing of claim 11 wherein the detector is selected from the group consisting of visible light detectors, infrared detectors, ultraviolet light detectors, and x-ray detectors.

15. The system for image sensing of claim 11 wherein the unit cell and the detector comprise an active pixel sensor (APS).

16. The system for image sensing of claim 11 wherein the MOSFET is operable to be turned off before a reset of the unit cell occurs and to be turned on after a reset of the unit cell occurs, wherein the MOSFET does not contribute to a reset noise of the unit cell.

17. A method for image sensing comprising:
 coupling a MOSFET to a unit cell, the MOSFET having a source, a drain, and a gate, the drain coupled to the source;
 coupling a first end of an integration capacitor to the drain of the MOSFET, and coupling a second end of the integration capacitor to a ground;
 turning the MOSFET off a first time;
 resetting the unit cell after turning the MOSFET off a first time;
 turning the MOSFET on after resetting the unit cell;
 detecting a light intensity with a detector after turning the MOSFET on and generating an electric charge in proportion to the detected light intensity;
 storing the electric charge in the unit cell, a portion of the electric charge being stored in the MOSFET; and
 transmitting data corresponding to the electric charge stored in the unit cell to an image processing unit.

18. The method for image sensing of claim 17 further comprising:
 turning the MOSFET off a second time after transmitting the electric charge to an image processing unit; and
 transmitting data corresponding to the electric charge stored in the unit cell to an image processing unit after turning the MOSFET off a second time.

19. The method for image sensing of claim 17 wherein the unit cell and the detector comprise an active pixel sensor (APS).

20. The method for image sensing of claim 17 wherein the data corresponding to the electric charge stored in the unit cell comprises an electric charge.

21. The method for image sensing of claim 17 wherein the data corresponding to the electric charge stored in the unit cell comprises a voltage.

22. The method for image sensing of claim 17 wherein the detector is selected from the group consisting of visible light detectors, infrared detectors, ultraviolet light detectors, and x-ray detectors.

* * * * *